US012750954B2

(12) United States Patent
Sakurai

(10) Patent No.: US 12,750,954 B2

(45) Date of Patent: Sep. 29, 2026

(54) ELECTRONIC COMPONENT AND METHOD OF MANUFACTURING THE SAME

(71) Applicant: Murata Manufacturing Co., Ltd., Nagaokakyo (JP)

(72) Inventor: Atsushi Sakurai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 205 days.

(21) Appl. No.: 18/751,913

(22) Filed: Jun. 24, 2024

(65) Prior Publication Data

US 2024/0349426 A1 Oct. 17, 2024

Related U.S. Application Data

(63) Continuation of application No. PCT/JP2023/003593, filed on Feb. 3, 2023.

(30) Foreign Application Priority Data

Feb. 17, 2022 (JP) ................................ 2022-023242

(51) Int. Cl.

*H05K 1/11* (2006.01)
*H05K 1/02* (2006.01)
*H05K 3/42* (2006.01)

(52) U.S. Cl.

CPC ........... *H05K 1/115* (2013.01); *H05K 1/0298* (2013.01); *H05K 3/422* (2013.01); *H05K 2201/0323* (2013.01); *H05K 2201/09545* (2013.01)

(58) Field of Classification Search

CPC ...................................................... H05K 1/115
USPC ......................................................... 174/251
See application file for complete search history.

(56) References Cited

U.S. PATENT DOCUMENTS

2002/0050320 A1* 5/2002 Ikeda ................ B23K 35/0222
156/284

FOREIGN PATENT DOCUMENTS

| | | | |
|---|---|---|---|
| JP | 2001-156452 A | | 6/2001 |
| JP | 2010-123830 A | | 6/2010 |
| JP | 201023830 | * | 6/2010 |
| JP | 2017139294 | * | 8/2010 |

(Continued)

OTHER PUBLICATIONS

International Search Report received for PCT Patent Application No. PCT/JP2023/003593, mailed on Apr. 18, 2023, 2 pages (English Translation Only).

*Primary Examiner* — Stanley Tso
(74) *Attorney, Agent, or Firm* — ArentFox Schiff LLP

(57) ABSTRACT

An electronic component that includes: a substrate; a first electrode layer on the substrate and including conductive fillers and a binder; an insulation layer on the first electrode layer, the insulation layer having a via hole that penetrates the insulation layer in a lamination direction of the substrate, the first electrode layer, and the insulation layer; a second electrode layer on the insulation layer; and a via conductor in the via hole, the via conductor electrically coupling the first electrode layer and the second electrode layer, wherein a portion of the first electrode layer overlapping with the via hole in a top view includes a coupling layer coupled to the via conductor, the coupling layer having a content rate of the binder lower than a content rate of the binder in a portion of the first electrode layer positioned outside the via hole in the top view.

16 Claims, 5 Drawing Sheets

(56) References Cited

FOREIGN PATENT DOCUMENTS

| | | | |
|---|---|---|---|
| JP | 2013-183155 | A | 9/2013 |
| JP | 2017-139294 | A | 8/2017 |

* cited by examiner

ELECTRONIC COMPONENT AND METHOD OF MANUFACTURING THE SAME

CROSS REFERENCE TO RELATED APPLICATIONS

The present application is a continuation of International application No. PCT/JP2023/003593, filed Feb. 3, 2023, which claims priority to Japanese Patent Application No. 2022-023242, filed Feb. 17, 2022, the entire contents of each of which are incorporated herein by reference.

TECHNICAL FIELD

The present disclosure relates to an electronic component and a method of manufacturing the electronic component.

BACKGROUND ART

A multilayer substrate including a component-embedded substrate, for example, has a wiring structure to ensure electrical coupling between layers through an interstitial via hole (IVH) in many cases, in order to highly densely mount devices constituting an electronic circuit. A method of manufacturing a multilayer substrate having the above-described wiring structure is described in Patent Document 1, for example.

In the manufacturing method of Patent Document 1, first, an inner layer circuit board is produced by forming an inner layer conductor circuit as an electrode layer on both surfaces of an insulation base material. Next, after the surface treatment of the inner layer conductor circuit, an insulation layer with copper foil is formed on both surfaces of the inner layer circuit board. Subsequently, the copper foil is etched to form an opening in the copper foil, and a laser is radiated into the opening to form a via hole, reaching the inner layer conductor circuit, in the insulation layer. Thereafter, an electroless plating metal being a via conductor is filled in the via hole.

Patent Document 1: Japanese Unexamined Patent Application Publication No. 2001-156452

SUMMARY OF THE DISCLOSURE

As described in Patent Document 1, when an electronic component having an interstitial via hole such as a multilayer substrate, for example, is manufactured, a via hole is formed in an insulation layer to expose an electrode layer and the via hole is filled with a via conductor to couple the electrode layer and the via conductor. The electrode layer is made of a plating film or a sputtered film, for example. However, in the above-described method, it is hard to firmly couple the electrode layer and the via conductor. In a case that coupling strength between the electrode layer and the via conductor is insufficient, when stress is generated in the electronic component, for example, separation may occur at an interface between the electrode layer and the via conductor, and this may make it hard to ensure the electrical conductivity between the electrode layer and the via conductor. Thus, a problem that the reliability of the electronic component lowers may arise.

An object of the present disclosure is to increase coupling strength between an electrode layer and a via conductor and to ensure the reliability of an electronic component.

An electronic component according to the present disclosure includes: a substrate; a first electrode layer on the substrate and including conductive fillers and a binder; an insulation layer on the first electrode layer, the insulation layer having a via hole that penetrates the insulation layer in a lamination direction of the substrate, the first electrode layer, and the insulation layer; a second electrode layer on the insulation layer; and a via conductor in the via hole, the via conductor electrically coupling the first electrode layer and the second electrode layer, wherein a portion of the first electrode layer overlapping with the via hole in a top view includes a coupling layer coupled to the via conductor, the coupling layer having a content rate of the binder lower than a content rate of the binder in a portion of the first electrode layer positioned outside the via hole in the top view.

According to the present disclosure, the coupling strength between the electrode layer and the via conductor may be increased. As a result, the reliability of the electronic component may be ensured.

DESCRIPTION OF THE PREFERRED EMBODIMENTS

Figure 1:
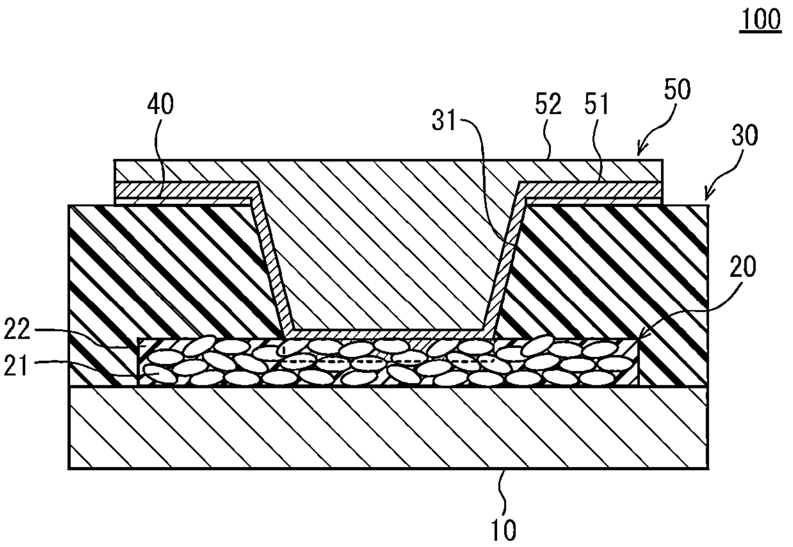
FIG. 1 is a sectional view of an electronic component according to an embodiment.

An electronic component according to an embodiment includes a substrate; a first electrode layer on the substrate and including conductive fillers and a binder; an insulation layer on the first electrode layer, the insulation layer having a via hole that penetrates the insulation layer in a lamination direction of the substrate, the first electrode layer, and the insulation layer; a second electrode layer on the insulation layer; and a via conductor in the via hole, the via conductor electrically coupling the first electrode layer and the second electrode layer, wherein a portion of the first electrode layer overlapping with the via hole in a top view includes a coupling layer coupled to the via conductor, the coupling layer having a content rate of the binder lower than a content rate of the binder in a portion of the first electrode layer positioned outside the via hole in the top view (first configuration).

In the electronic component according to the first configuration, a portion of the first electrode layer on the substrate, which overlaps with the via hole of the insulation layer in a top view, includes a coupling layer coupled to the via conductor. In the coupling layer, the content rate of the binder is relatively small, and thus a portion of the via conductor may enter a gap between the conductive fillers. This makes the coupling layer be firmly coupled to the via conductor, and coupling strength between the first electrode layer including the coupling layer and the via conductor may be increased. As a result, the first electrode layer and the via conductor are less likely to be separated from each other, and a decrease in conductivity due to the separation may be prevented. Thus, the reliability of the electronic component may be ensured.

The conductive fillers are bonded to each other in the coupling layer, and a portion of the via conductor may be present in the gap between the bonded conductive fillers (second configuration).

According to the second configuration, a portion of the via conductor enters the gap between the conductive fillers in the coupling layer of the first electrode layer. This makes it possible to increase a contact area between the first electrode layer and the via conductor. Thus, wiring resistance between the first electrode layer and the via conductor may be lowered.

An electronic component according to another embodiment includes a substrate; a first electrode layer on the substrate and including conductive fillers and a binder; an insulation layer on the first electrode layer, the insulation layer having a via hole that penetrates the insulation layer in a lamination direction of the substrate, the first electrode layer, and the insulation layer; a second electrode layer on the insulation layer; and a via conductor in the via hole, the via conductor electrically coupling the first electrode layer and the second electrode layer, wherein a portion of the first electrode layer overlapping with the via hole in a top view includes a coupling layer coupled to the via conductor, wherein in the coupling layer the conductive fillers are bonded to each other and a part of the via conductor is present in a gap between the bonded conductive fillers (third configuration).

In the electronic component according to the third configuration, a portion of the first electrode layer on the substrate, which overlaps with the via hole of the insulation layer in a top view, includes a coupling layer coupled to the via conductor. In the coupling layer, the conductive fillers are bonded to each other, and a portion of the via conductor enters the gap between the bonded conductive fillers. This makes the coupling layer be firmly coupled to the via conductor, and coupling strength between the first electrode layer including the coupling layer and the via conductor may be increased. As a result, the first electrode layer and the via conductor are less likely to be separated from each other, and a decrease in conductivity due to the separation may be prevented. Thus, the reliability of the electronic component may be ensured. Further, since a portion of the via conductor enters the gap between the conductive fillers, a contact area between the first electrode layer and the via conductor may be increased, and wiring resistance between the first electrode layer and the via conductor may be lowered.

The portion of the first electrode layer overlapping with the via hole in the top view may further include a base layer. The base layer is disposed between the coupling layer and the substrate. A content rate of the binder in the base layer is higher than the content rate of the binder in the coupling layer (fourth configuration).

According to the fourth configuration, the base layer having a higher content rate of the binder than that of the coupling layer is disposed between the coupling layer and the substrate. The base layer may protect the substrate.

The conductive filler may have a melting point of 1100° C. or less (fifth configuration).

In most cases, after a via hole is formed in an insulation layer and before a via conductor is introduced into the via hole, a surface on which the via conductor is to be formed is subjected to pretreatment such as activation. The pretreatment is suitable for a type of metal used as the via conductor. For the via conductor, a metal having a melting point of 1100° C. or less, such as copper, for example, is often used. In view of the above, in the fifth configuration, a conductive filler having a melting point of 1100° C. or less is used as the conductive filler contained in the first electrode layer. That is, the surface of the first electrode layer to be a bottom surface of the via hole is in a state suitable for a known pretreatment. Thus, the electronic component may be manufactured without largely changing a known manufacturing process.

A content rate of the conductive filler in the portion of the first electrode layer positioned outside the via hole may be 30 vol % to 80 vol % (sixth configuration).

In the sixth configuration, the conductive filler is highly blended with the content rate of 30 vol % to 80 vol % in the first electrode layer. Thus, preferable conductivity of the first electrode layer may be ensured.

The first electrode layer may have a thickness of 10 μm to 40 μm (seventh configuration).

In the seventh configuration, the thickness of the first electrode layer is 10 μm to 40 μm. This makes it possible to sufficiently lower electrical resistance of the first electrode layer. Further, since the thickness of the first electrode layer is not excessively large, the first electrode layer may easily be formed on the substrate in the manufacturing process of the electronic component.

The coupling layer may have surface roughness Rz of 1 μm to 10 μm (eighth configuration).

In the eighth configuration, the surface roughness Rz of the coupling layer in the first electrode layer is 1 μm to 10 μm. This makes it possible to ensure a contact area between the coupling layer and the via conductor, and the coupling strength between the first electrode layer and the via conductor may further be increased. Further, the wiring resistance between the first electrode layer and the via conductor may further be lowered.

The insulation layer may have a thickness of 20 μm to 50 μm (ninth configuration).

In the ninth configuration, the thickness of the insulation layer is 20 μm to 50 μm. This makes it possible to prevent the electrical resistance of the via hole provided in the insulation layer from increasing, while ensuring insulation property of the insulation layer.

The insulation layer may be made of an epoxy-based resin (tenth configuration).

In the tenth configuration, the insulation layer between the electrode layers is made of the epoxy-based resin. The epoxy-based resin is suitable for the insulation layer because it is easily processed by a laser, for example, and has a relatively high insulation property.

The via hole may have a section of a circular shape, for example. In the case above, a diameter of the via hole on a side of the first electrode layer may be 40 μm to 120 μm (eleventh configuration).

In the eleventh configuration, the diameter of the via hole on the side of the first electrode layer is 40 μm to 120 μm. This makes it possible to more reliably couple the via conductor in the via hole to the coupling layer of the first electrode layer.

The insulation layer is made of a resin, for example. In the case above, the via conductor preferably includes an electroless plating layer and an electrolytic plating layer. The electroless plating layer is provided on a side wall of the via hole. The electrolytic plating layer is provided on the electroless plating layer (twelfth configuration).

When the insulation layer is made of a resin, it is hard to form an electrolytic plating layer directly on the side wall of the via hole provided in the insulation layer. In the twelfth configuration, therefore, the electroless plating layer is provided as a seed layer on the side wall of the via hole, and the electrolytic plating layer is overlaid on the electroless plating layer. This makes it possible to provide the electrolytic plating layer on the side wall of the via hole and ensure close contact between the via conductor including the electrolytic plating layer and the insulation layer.

The electronic component may further include a conductive layer provided between the substrate and the first electrode layer (thirteenth configuration). The conductive layer is a carbon layer containing a carbon filler, for example (fourteenth configuration).

A method of manufacturing the electronic component according to the embodiment includes preparing the substrate; forming the first electrode layer by applying the conductive filler and the conductive paste on the substrate, the conductive paste containing the binder in which the conductive fillers are dispersed; forming the insulation layer on the first electrode layer; forming the second electrode layer on the insulation layer; forming the via hole in the insulation layer to expose a portion of the first electrode layer through the via hole; heating the portion of the first electrode layer exposed through the via hole so as to bond the conductive fillers to each other and burn the binder and form a porous layer where there is a gap between the conductive fillers; and forming the via conductor in the via hole after forming the porous layer on the first electrode layer (fifteenth configuration).

In the manufacturing method according to the embodiment, formed is the porous layer in which the gap is formed between the conductive fillers to have a porous shape, by heating a portion of the first electrode layer exposed through the via hole to fuse the conductive fillers to be bonded to each other and to burn the binder at the portion. Thus, when the via conductor is formed, a portion of the via conductor may fill the gap between the conductive fillers in the porous layer by being made to enter the gap. Thus, the first electrode layer is firmly coupled to the via conductor, and the coupling strength between the first electrode layer and the via conductor may be increased. As a result, the first electrode layer and the via conductor are less likely to be separated from each other, and a decrease in conductivity due to the separation may be prevented. Thus, the reliability of the electronic component to be manufactured may be ensured. Further, since the via conductor enters the porous layer formed in the first electrode layer, the contact area between the first electrode layer and the via conductor may be increased, and thus the wiring resistance between the first electrode layer and the via conductor may be lowered.

In the above-described manufacturing method, the porous layer may be formed by irradiating the portion of the first electrode layer exposed through the via hole with a laser (sixteenth configuration).

According to the sixteenth configuration, the porous layer is formed by irradiating a portion of the first electrode layer exposed through the via hole with a laser. In a case of laser processing, temperature controllability of the processing surface is favorable, and therefore, the porous layer may easily be formed.

The laser preferably has a wavelength in an infrared region (seventeenth configuration).

In the manufacturing method according to the embodiment, the first electrode layer is formed using a conductive paste containing a conductive filler and a binder. The binder, being a resin, for example, has high infrared absorptivity and it is easy to process by a laser having a wavelength in the infrared region. In contrast, the conductive filler, being a metal, for example, has low infrared absorptivity and it is hard to process by a laser having a wavelength in the infrared region. As a result, when the first electrode layer is irradiated with a laser having a wavelength in the infrared region as in the seventeenth configuration, not only the binder may more reliably be burned and eliminated, but also appropriate fusing and bonding of the conductive filler may be achieved. Thus, the porous layer may easily be formed in the portion of the first electrode layer exposed through the via hole.

Hereinafter, embodiments of the present disclosure will be described with reference to the drawings. In the drawings, the same or equivalent components are denoted by the same reference signs, and the same description will not be repeated.

[Configuration of Electronic Component]

FIG. 1 is a sectional view of an electronic component 100 according to the present embodiment. The electronic component 100 is a component including a wiring structure to ensure interlayer coupling by a via hole. The electronic component 100 may be a multilayer substrate (package substrate) such as a component-embedded substrate or a portion thereof, for example.

With reference to FIG. 1, the electronic component 100 includes a substrate 10, a first electrode layer 20, an insulation layer 30, a second electrode layer 40, and a via conductor 50. In the electronic component 100, the substrate 10, the first electrode layer 20, the insulation layer 30, and the second electrode layer 40 are laminated in this order. Hereinafter, for convenience of description, a lamination direction of the substrate 10, the first electrode layer 20, the insulation layer 30, and the second electrode layer 40 may be referred to as an up-low direction; and a side of the substrate 10 may be referred to as a low side and a side of the second electrode layer 40 may be referred to as an upper side.

The substrate 10 has a plate shape or a foil shape. The substrate 10 has conductivity and is made of a metal, for example. When the electronic component 100 is a component-embedded substrate or a portion thereof and includes a capacitor, the substrate 10 may be an anode of the capacitor. For example, when the substrate 10 is provided in the electronic component 100 as an anode of an electrolytic capacitor, the substrate 10 is preferably made of a valve metal. Examples of the valve metal include a metal element such as aluminum, tantalum, niobium, titanium, or zirconium; and an alloy containing at least one of the metals above. It is particularly preferable that the valve metal is aluminum or aluminum alloy.

The first electrode layer 20 is provided on the substrate 10. In the example illustrated in FIG. 1, the first electrode layer 20 is disposed on one surface of the substrate 10. When the substrate 10 is an anode of a capacitor, the first electrode layer 20 may be a cathode of the capacitor. The first electrode layer 20 preferably has a thickness of 10 μm to 40 μm. The thickness of the first electrode layer 20 is a length of the first electrode layer 20 in the up-low direction. The first electrode layer 20 contains a conductive filler 21 and a binder 22.

The conductive filler 21 has a particle shape, a flake shape, a rod shape, or the like, for example. The conductive filler 21 has conductivity. The conductive filler 21 may be a metal filler containing a metal such as copper, nickel, or silver as a main component, or may be a non-metal filler. The conductive filler 21 has a melting point of 1100° C. or less, for example. The conductive filler 21 is preferably a copper filler containing copper as a main component.

The binder 22 contains the conductive filler 21. That is, a large number of conductive fillers 21 are dispersed in the binder 22. As the binder 22, a binder used for a known conductive adhesive may appropriately be selected and used. The binder 22 is a resin, for example. The binder 22 may be a thermosetting resin.

The insulation layer 30 is provided on the first electrode layer 20. In the example illustrated in FIG. 1, the insulation layer 30 is disposed on the substrate 10 and the first electrode layer 20 so as to cover the entire first electrode layer 20. The insulation layer 30 preferably has a thickness of 20 μm to 50 μm. A thickness of the insulation layer 30 is a length of the insulation layer 30 in the up-low direction.

The insulation layer 30 is typically made of a resin. The insulation layer 30 may be made of a thermosetting resin, for example. The insulation layer 30 is preferably made of an epoxy-based resin. Examples of the epoxy-based resin include phenol curable epoxy resin, cyanate ester/epoxy mixed resins, and phenol ester curable epoxy resin.

A via hole 31 is formed in the insulation layer 30. The via hole 31 penetrates the insulation layer 30 in the lamination direction (up-low direction) of the substrate 10, the first electrode layer 20, and the insulation layer 30. The via hole 31 extends downward from an upper surface of the insulation layer 30 and reaches the first electrode layer 20. In the example illustrated in FIG. 1, an opening area of the via hole 31 on a side of the first electrode layer 20 is smaller than an opening area of the via hole 31 on a side opposite to the first electrode layer 20. The via hole 31 is formed in a tapered shape in which a width gradually decreases toward the first electrode layer 20 in a sectional view of the electronic component 100 including a central axis of the via hole 31. However, the via hole 31 may have a constant width throughout the entire via hole 31 in a sectional view of the electronic component 100 including the central axis of the via hole 31. That is, the opening area of the via hole 31 on the side of the first electrode layer 20 may be substantially equal to the opening area of the via hole 31 on the side opposite to the first electrode layer 20.

The via hole 31 may have a transverse section of a circular shape, for example. The transverse section of the via hole 31 is a section of the via hole 31 taken along a plane perpendicular to the central axis of the via hole 31. When the transverse section of the via hole 31 has the circular shape, a diameter of the via hole 31 on the side of the first electrode layer 20 is preferably 40 μm to 120 μm.

The second electrode layer 40 is provided on the insulation layer 30. In the example illustrated in FIG. 1, the second electrode layer 40 is provided around the via hole 31 on the surface of the insulation layer 30 on the side opposite to the first electrode layer 20.

The second electrode layer 40 has conductivity. The second electrode layer 40 is made of a metal, for example. The second electrode layer 40 may be a metal film containing copper, silver, gold, or the like as a main component, for example. The metal film is a plating film or a sputtered film, for example. Alternatively, the second electrode layer 40 may contain a conductive filler and a binder, same as the first electrode layer 20.

The via conductor 50 is provided in the via hole 31 and electrically couples the first electrode layer 20 and the second electrode layer 40. In the example illustrated in FIG. 1, the via conductor 50 includes an electroless plating layer 51 and an electrolytic plating layer 52.

The electroless plating layer 51 is directly provided on a side wall of the via hole 31. The electroless plating layer 51 is also provided on the first electrode layer 20 exposed from the lower opening of the via hole 31, and on the second electrode layer 40 formed on the insulation layer 30. That is, the electroless plating layer 51 is continuously formed from a bottom of the via hole 31 to the upper surface of the insulation layer 30 so as to cover the first electrode layer 20, the side wall of the via hole 31, and the second electrode layer 40. The electroless plating layer 51 is a metal film deposited by a chemical reaction. Although not particularly limited, the electroless plating layer 51 is preferably an electroless copper plating layer.

The electrolytic plating layer 52 is provided on the electroless plating layer 51. The electrolytic plating layer 52 covers the entire electroless plating layer 51. The electrolytic plating layer 52 is a metal film deposited by using electricity. Although not particularly limited, the electrolytic plating layer 52 is preferably an electrolytic copper plating layer.

In the example illustrated in FIG. 1, a so-called filled via is used for coupling of the electrode layers 20 and 40, and the via conductor 50 including the electroless plating layer 51 and the electrolytic plating layer 52 is filled in the via hole 31. However, the via conductor 50 may be recessed along the via hole 31. That is, the electrode layers 20 and 40 may be coupled by a so-called conformal via.

Figure 2:
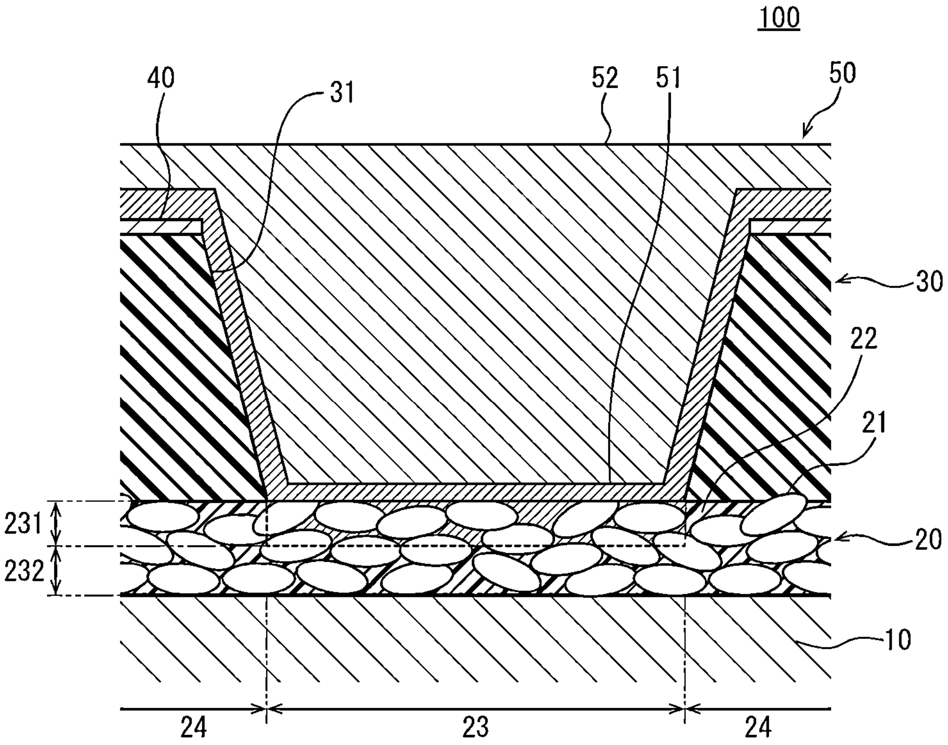
FIG. 2 is a partially enlarged view of the section of the electronic component illustrated in FIG. 1.

FIG. 2 is an enlarged view of the via hole 31 and a vicinity thereof in a section of the electronic component 100 illustrated in FIG. 1. Hereinafter, the first electrode layer 20, particularly, a portion of the first electrode layer 20 corresponding to the via hole 31 will be described in detail with reference to FIG. 2.

As illustrated in FIG. 2, a portion of the first electrode layer 20 corresponding to the via hole 31, in other words, a portion (via hole portion) 23 positioned just under the via hole 31 includes a coupling layer 231 and a base layer 232. The via hole portion 23 is a portion of the first electrode layer 20 that overlaps with the via hole 31 in a top view of the electronic component 100, and is a portion exposed through the via hole 31 when the via conductor 50 is not present. The via hole portion 23 is disposed inside the via hole 31 when the first electrode layer 20 is viewed from a side of the insulation layer 30. The coupling layer 231 is a layer that is disposed adjacent to the via hole 31 and is coupled to part of the via conductor 50. The base layer 232 is disposed between the coupling layer 231 and the substrate 10.

The coupling layer 231 and the base layer 232 each contain the conductive filler 21. However, the states of the conductive fillers 21 are different between the coupling layer 231 and the base layer 232. In the coupling layer 231, the conductive fillers 21 are bonded to each other. More specifically, in the coupling layer 231, the plurality of conductive fillers 21 are fused and bonded to form a network structure. Meanwhile, in the base layer 232, the conductive fillers 21 overlap and are in contact with each other, but the conductive fillers 21 are not bonded to each other. Further, in a portion (non-via hole portion) 24 of the first electrode layer 20 positioned outside the via hole 31, the conductive fillers 21 overlap and are in contact with each other, but the conductive fillers 21 are not bonded to each other.

In the base layer 232 of the via hole portion 23, the binder 22 is filled in a gap between the conductive fillers 21 overlapping with each other. In the non-via hole portion 24 as well, the binder 22 is filled in the gap between the conductive fillers 21 overlapping with each other. Meanwhile, in the coupling layer 231 of the via hole portion 23, the amount of the binder 22 is smaller than that in the base layer 232 and the non-via hole portion 24. The coupling layer 231 may have substantially no binder 22. In the coupling layer 231, part of the via conductor 50 enters a gap between the conductive fillers 21 bonded to each other. That is, in the coupling layer 231, part of the via conductor 50, instead of the binder 22, is filled in the gap between the conductive fillers 21. This makes the coupling layer 231 be firmly coupled to the via conductor 50. A thickness (length in up-low direction) of the coupling layer 231 may be 1 μm to 30 μm, for example.

As described above, in the via hole portion 23, the amount of the binder 22 contained in the coupling layer 231 is smaller than the amount of the binder 22 contained in the base layer 232. Further, the amount of the binder 22 contained in the coupling layer 231 is smaller than the amount of the binder 22 contained in the non-via hole portion 24. That is, a content rate (vol %) of the binder 22 in the coupling layer 231 is smaller than a content rate (vol %) of the binder 22 in each of the non-via hole portion 24 and the base layer 232. When the content rate of the binder 22 in the coupling layer 231 is denoted as V1 and the content rate of the binder 22 in the base layer 232 is denoted as V2, V1/V2 is 0.95 or less, for example. When the content rate of the binder 22 in the coupling layer 231 is denoted as V1 and the content rate of the binder 22 in the non-via hole portion 24 is denoted as V0, V1/V0 is 0.95 or less, for example.

The content rate of the conductive filler 21 in the non-via hole portion 24 is preferably 30 vol % to 80 vol %. Further, in the non-via hole portion 24, the conductive filler 21 preferably has a particle diameter (average particle diameter) of 0.1 μm to 25.0 μm. The content rate of the conductive filler 21 in the base layer 232 of the via hole portion 23 may be 30 vol % to 80 vol %, same as the non-via hole portion 24. An average particle diameter of the conductive filler 21 in the base layer 232 may be 0.1 μm to 25.0 μm, same as the non-via hole portion 24.

The content rate (vol %) of each of the conductive filler 21 and the binder 22 in the via hole portion 23 may be measured using an image of a section of the electronic component 100. For example, an element mapping image of a section including the central axis of the via hole 31 is obtained by energy dispersive X-ray spectroscopy (SEM-EDX), and the content rate of the binder 22 in each of the coupling layer 231 and the base layer 232 may be obtained based on an area rate of the binder 22 in the image. Similarly, the content rate of the conductive filler 21 in the base layer 232 may be obtained based on an area rate of the conductive filler 21 in the element mapping image of a section including the central axis of the via hole 31. Further, the average particle diameter of the conductive filler 21 in the base layer 232 may be calculated by using the element mapping image of a section including the central axis of the via hole 31.

The content rate (vol %) of each of the conductive filler 21 and the binder 22 in the non-via hole portion 24 may also be measured using an image of a section of the electronic component 100. For example, an element mapping image of a section at a position sufficiently separated from the periphery of the via hole 31 is obtained, and the content rate of each of the conductive filler 21 and the binder 22 may be obtained based on the area rate of the binder 22 in the image. Further, the average particle diameter of the conductive filler 21 in the non-via hole portion 24 may be calculated using the image. Note that the conductive filler 21 does not necessarily have a spherical shape.

The coupling layer 231 of the via hole portion 23 preferably has surface roughness Rz of 1 μm to 10 μm. More specifically, the surface roughness Rz of a surface (upper surface) of the coupling layer 231 on a side of the via hole 31 is preferably 1 μm to 10 μm. The surface roughness Rz is the maximum height roughness defined in JIS B 0601: 2013. The surface roughness Rz of the non-via hole portion 24 is smaller than the surface roughness Rz of the coupling layer 231. The surface roughness Rz of each of the via hole portion 23 and the non-via hole portion 24 may also be calculated based on the corresponding sectional element mapping image, as in the case of the respective content rates of the conductive filler 21 and the binder 22.

[Method of Manufacturing Electronic Component]

Figure 3:
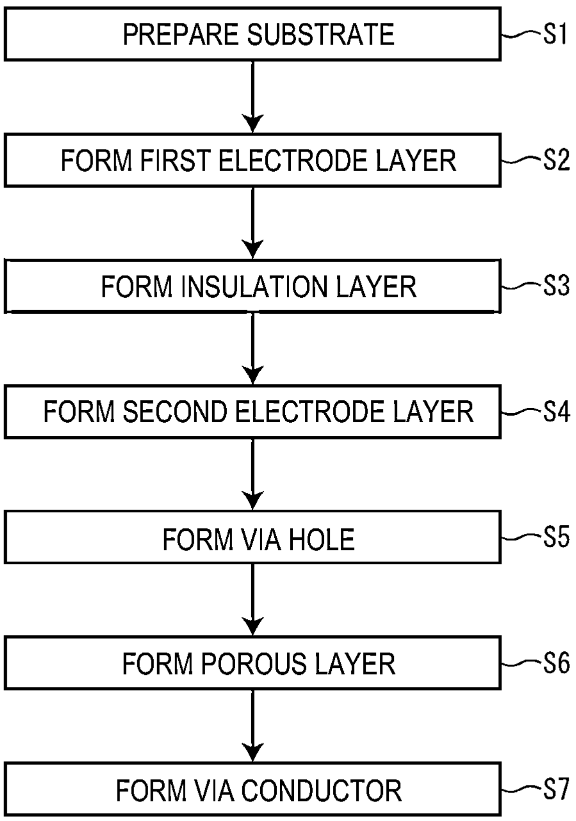
FIG. 3 is a flowchart of a method of manufacturing the electronic component according to the embodiment.

Next, an example of a method of manufacturing the electronic component 100 will be described with reference to FIG. 3 and FIG. 4A to FIG. 4H. FIG. 3 is a flowchart of the method of manufacturing the electronic component 100. FIG. 4A to FIG. 4H each are a schematic diagram for explaining a process included in the method of manufacturing.

As illustrated in FIG. 3, the method of manufacturing the electronic component 100 includes a process S1 of preparing the substrate 10, a process S2 of forming the first electrode layer 20 on the substrate 10, a process S3 of forming the insulation layer 30 on the first electrode layer 20, a process S4 of forming the second electrode layer 40 on the insulation layer 30, a process S5 of forming the via hole 31 in the insulation layer 30, a process S6 of forming the porous layer in the first electrode layer 20, and a process S7 of forming the via conductor 50 in the via hole 31. Each process will be described in detail below.

Figure 4A:
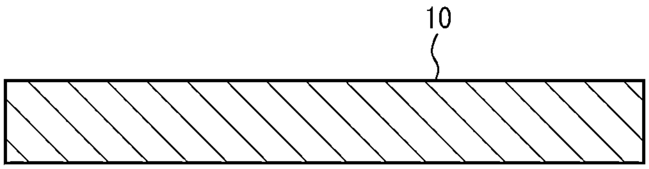
FIG. 4A is a diagram for explaining the method of manufacturing the electronic component.

With reference to FIG. 3 and FIG. 4A, in the process S1, the substrate 10 is prepared. As described above, the substrate 10 has conductivity. The substrate 10 may be a metal foil, for example.

The substrate 10 may be subjected to a predetermined treatment depending on the application. For example, when the substrate 10 is to be used as an anode of an electrolytic capacitor and the substrate 10 is made of a valve metal, the surface of the substrate 10 may be subjected to an anodic oxidation treatment (chemical treatment). As a result, a dielectric layer made of an oxide film may be formed on the surface of the substrate 10.

Figure 4B:
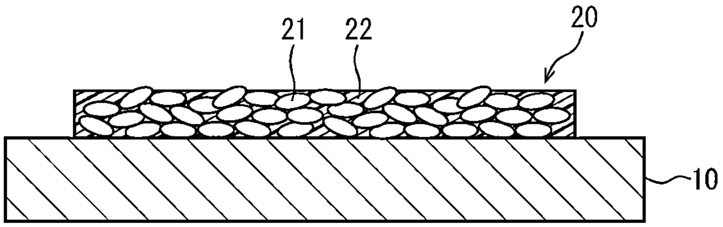
FIG. 4B is a diagram for explaining the method of manufacturing the electronic component.

With reference to FIG. 3 and FIG. 4B, in the process S2, a conductive paste is applied to the substrate 10 to form the first electrode layer 20. The conductive paste contains the conductive filler 21 and the binder 22 described above. The conductive paste may be produced by blending the conductive filler 21, having a nominal average particle diameter of 0.1 μm to 25.0 μm, with the binder 22 in a fluid state, for example. The content rate of the conductive filler 21 in the conductive paste is 30 vol % to 80 vol %, for example. The conductive paste is applied to a predetermined region on the substrate 10 by sponge transfer, screen printing, spray application, a dispenser, ink jet printing, or the like, for example. The conductive paste is applied onto the substrate 10 with a thickness of 10 μm to 40 μm, for example.

The conductive paste is applied onto the substrate 10 and is dried, and then the conductive paste is fired to form the first electrode layer 20. The conductive paste is fired at a temperature (approximately 200° C., for example) at which the binder 22 may thermally be cured and the conductive filler 21 is not fused.

Figure 4C:
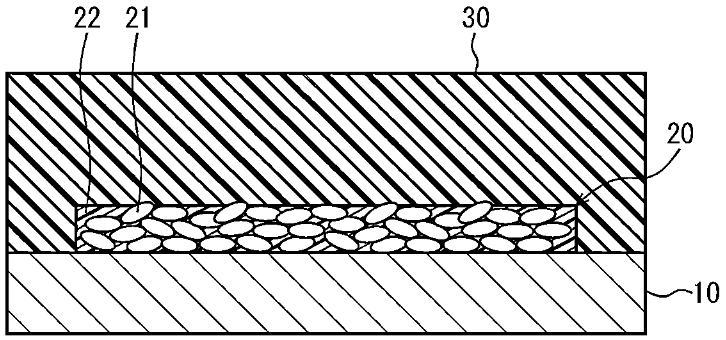
FIG. 4C is a diagram for explaining the method of manufacturing the electronic component.

With reference to FIG. 3 and FIG. 4C, in the process S3, the insulation layer 30 is formed on the first electrode layer 20. The method of forming the insulation layer 30 is not particularly limited. For example, the insulation layer 30 being a film-shape resin is prepared, and the insulation layer 30 is laminated on the substrate 10 with the first electrode layer 20 using a vacuum laminator. Thereafter, the multilayer body constituted of the substrate 10, the first electrode layer 20, and the insulation layer 30 is heated at a predetermined temperature for a predetermined time to thermally cure the insulation layer 30.

Figure 4D:
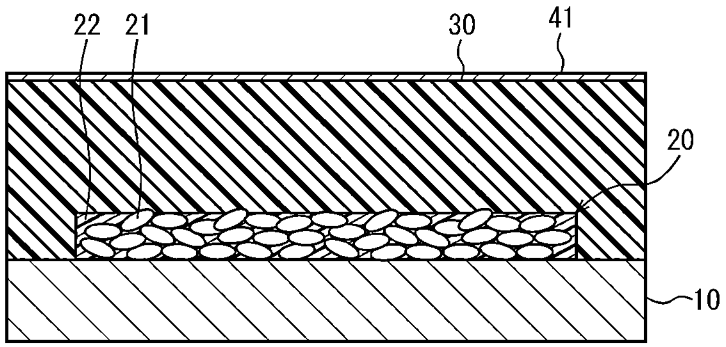
FIG. 4D is a diagram for explaining the method of manufacturing the electronic component.
Figure 4E:
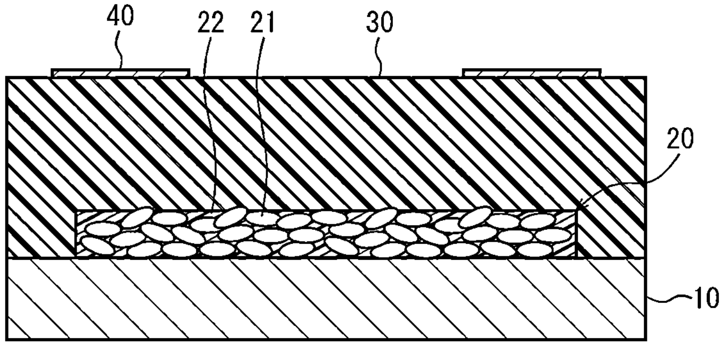
FIG. 4E is a diagram for explaining the method of manufacturing the electronic component.

With reference to FIG. 3, FIG. 4D, and FIG. 4E, in the process S4, the second electrode layer 40 is formed on the insulation layer 30. For example, by performing an electrolytic plating process or an electroless plating process on the insulation layer 30, a metal film 41 may be formed on the insulation layer 30 as a seed layer of the second electrode layer 40 as illustrated in FIG. 4D. Thereafter, part of the metal film 41 is removed by photolithography etching, and the second electrode layer 40 may be formed as illustrated in FIG. 4E. At this time, the metal film 41, at a portion of the insulation layer 30 where the via hole 31 is to be formed, is removed as well.

Figure 4F:
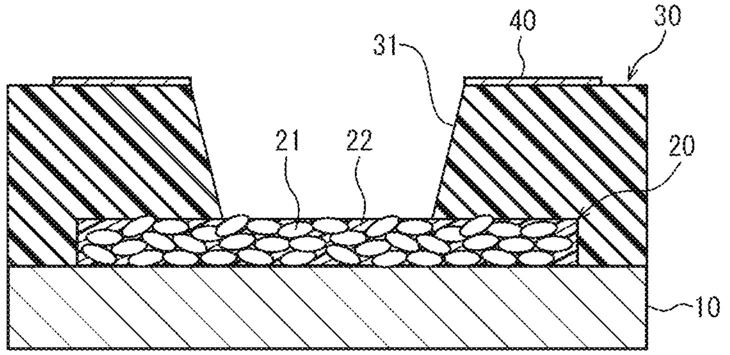
FIG. 4F is a diagram for explaining the method of manufacturing the electronic component.

With reference to FIG. 3 and FIG. 4F, in the process S5, the via hole 31 is formed in the insulation layer 30 to expose a portion of the first electrode layer 20 through the via hole 31. For example, by processing the insulation layer 30 using a laser processing machine, the via hole 31 penetrating through the insulation layer 30 may be formed. The laser for processing the insulation layer 30 is a $CO_2$ laser, for example. The laser preferably has a wavelength in the infrared region.

Figure 4G:
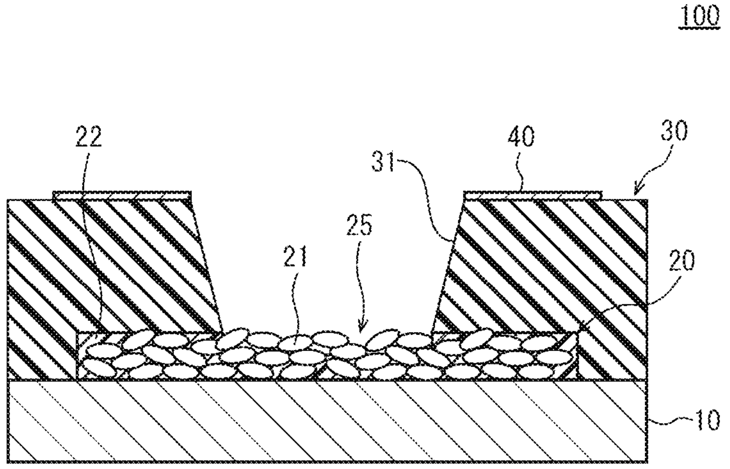
FIG. 4G is a diagram for explaining the method of manufacturing the electronic component.

Following the process S5, the process S6 is performed. With reference to FIG. 3 and FIG. 4G, in the process S6, the portion of the first electrode layer 20 exposed through the via hole 31 is heated to fuse and bond the conductive fillers 21 to each other and to burn the binder 22. As a result, a porous layer 25 is formed in the portion of the first electrode layer 20 exposed through the via hole 31.

In the process S6, the porous layer 25 is formed by irradiating a portion of the first electrode layer 20 exposed through the via hole 31 with a laser. The porous layer 25 is formed, by forming the via hole 31 in the insulation layer 30 by a laser, and then consecutively irradiating the first electrode layer 20 with the laser. When the first electrode layer 20 is irradiated with the laser, the conductive fillers 21 that are merely overlapped with each other are fused and bonded to form a network structure. Further, in a portion of the first electrode layer 20 irradiated with the laser, the binder 22 is burned and disappears. As a result, there is formed a gap in which the binder 22 is not present between the conductive fillers 21 which are bonded to each other to form the network structure. The porous layer 25 is a layer in a porous state resulted from such a gap being formed between the conductive fillers 21. The porous layer 25 preferably does not reach the substrate 10.

In the process S6, the laser radiated to the portion of the first electrode layer 20 exposed through the via hole 31 preferably has a wavelength in the infrared region. The wavelength of the laser is more preferably 2000 nm to 20000 nm.

Figure 4H:
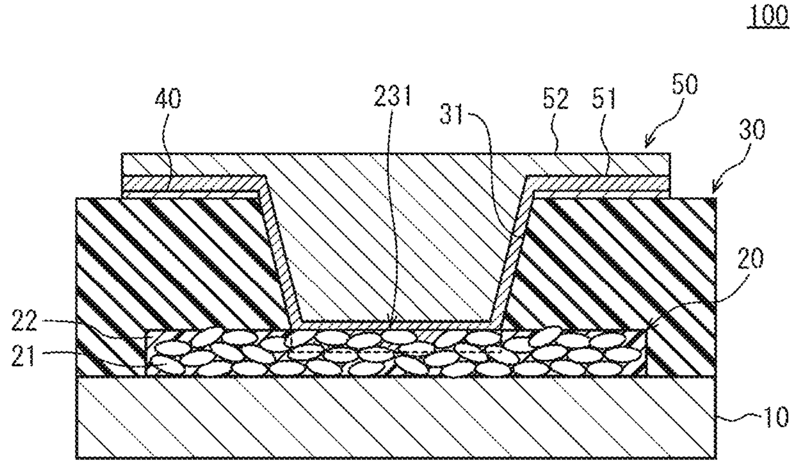
FIG. 4H is a diagram for explaining the method of manufacturing the electronic component.

With reference to FIG. 3 and FIG. 4H, after the porous layer 25 is formed on the first electrode layer 20, the via conductor 50 is formed in the via hole 31 in the process S7. For example, first, the electroless plating layer 51 is formed by performing the electroless plating process on the side wall of the via hole 31, the portion of the first electrode layer 20 exposed through the via hole 31, and a surface of the second electrode layer 40. Next, the electrolytic plating layer 52 is formed on the electroless plating layer 51 by electrolytic plating process.

When the via conductor 50 is formed in the process S7, the via conductor 50 fits the porous layer 25. More specifically, part of the via conductor 50 enters a large number of gaps formed between the conductive fillers 21 in the porous layer 25, and fills the gaps. Thus, the porous layer 25 becomes the coupling layer 231 to couple the via conductor 50. The via conductor 50 is firmly coupled to the first electrode layer 20 with the coupling layer 231.

Effects

Figure 5:
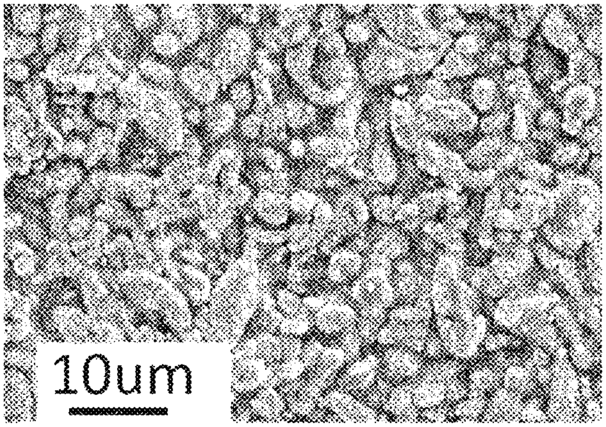
FIG. 5 is a scanning electron microscope image of a surface of the electronic component according to the embodiment.
Figure 6:
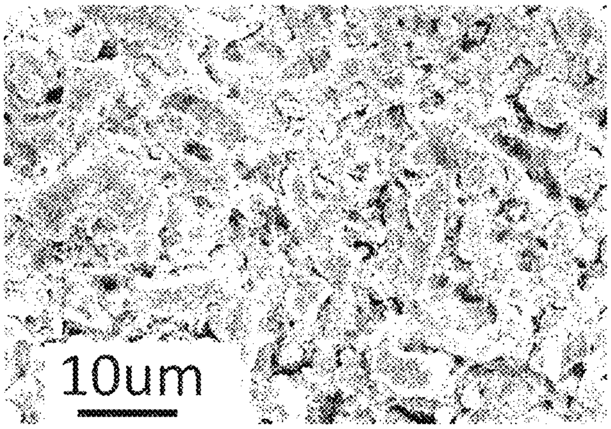
FIG. 6 is a scanning electron microscope image of another surface of the electronic component according to the embodiment.

FIG. 5 is a scanning electron microscope image (SEM image) of a surface of the non-via hole portion 24 of the first electrode layer 20. FIG. 6 is a SEM image of a surface of the coupling layer 231 in the via hole portion 23 of the first electrode layer 20. As can be seen from FIG. 5 and FIG. 6, in the coupling layer 231, the conductive fillers 21 are bonded to each other to form a network structure, unlike in the non-via hole portion 24 in which the conductive fillers 21 are merely overlapped with each other. In the coupling layer 231, part of the via conductor 50 enters the gap between the conductive fillers 21 having the network structure. The first electrode layer 20 is firmly coupled to the via conductor 50 with the coupling layer 231, and thus coupling strength between the first electrode layer 20 and the via conductor 50 may be increased. As a result, the first electrode layer 20 and the via conductor 50 are less likely to be separated from each other, and a decrease in conductivity due to the separation may be prevented. Thus, the reliability of the electronic component 100 may be ensured.

Further, with the via conductor 50 entering the gap between the conductive fillers 21 in the coupling layer 231 of the first electrode layer 20, a contact area between the first electrode layer 20 and the via conductor 50 may be increased as well. Thus, the wiring resistance between the first electrode layer 20 and the via conductor 50 may be lowered.

In the present embodiment, the base layer 232 is disposed between the coupling layer 231 of the first electrode layer 20 and the substrate 10. When the porous layer 25 that finally becomes the coupling layer 231 is formed in the first electrode layer 20 by a laser, for example, the first electrode layer 20 is processed such that the base layer 232 remains on the substrate 10. As a result, the substrate 10 may be protected from damage due to laser processing, for example.

In the present embodiment, the conductive filler 21 included in the first electrode layer 20 is a filler having a melting point of 1100° C. or less, for example. The conductive filler 21 is preferably a copper filler. This makes the first electrode layer 20 suitable for a known manufacturing process in which a metal having a melting point of 1100° C. or less, such as copper, for example, is used as a conductive material. Thus, the electronic component 100 may be manufactured without largely changing the known manufacturing process. Further, since electrical resistance of the copper filler is relatively small, preferable conductivity of the first electrode layer 20 may be ensured.

In the present embodiment, the content rate of the conductive filler 21 in the first electrode layer 20 is preferably 30 vol % to 80 vol %. In the case above, the conductive filler 21 is highly blended in the first electrode layer 20. Thus, preferable conductivity of the first electrode layer 20 may be ensured.

In the present embodiment, the thickness of the first electrode layer 20 is preferably 10 μm to 40 μm. This may make the electrical resistance of the first electrode layer 20 be sufficiently small. Further, since the thickness of the first electrode layer 20 is not excessively large, the first electrode layer 20 is easily formed on the substrate 10 in the manufacturing process of the electronic component 100.

In the present embodiment, the surface roughness Rz of the coupling layer 231 of the first electrode layer 20 is preferably 1 μm to 10 μm. This makes it possible to appropriately ensure a contact area between the coupling layer 231 and the via conductor 50, and the coupling strength between the first electrode layer 20 and the via conductor 50 may further be increased. Further, the wiring resistance between the first electrode layer 20 and the via conductor 50 may further be lowered.

In the present embodiment, the thickness of the insulation layer 30 is preferably 20 μm to 50 μm. This prevents an increase of the electrical resistance of the via hole 31 penetrating through the insulation layer 30, while ensuring the insulation property of the insulation layer 30.

In the present embodiment, the insulation layer 30 is preferably made of an epoxy-based resin. The insulation layer 30 may be made of a phenol curable epoxy resin, a cyanate ester/epoxy mixed resin, a phenol ester curable epoxy resin, or the like, for example. The resins above are easily processed by a laser, for example, and have a relatively high insulation property.

In the present embodiment, when the via hole 31 has a section of a circular shape, the diameter of the via hole 31 on the side of the first electrode layer 20 is preferably 40 μm to 120 μm. This makes it possible to more reliably couple the via conductor 50 in the via hole 31 to the coupling layer 231 of the first electrode layer 20.

In the present embodiment, the insulation layer 30 is made of a resin, for example. In the case above, the via conductor 50 provided in the via hole 31 of the insulation layer 30 preferably includes the electroless plating layer 51 and the electrolytic plating layer 52. By providing the electroless plating layer 51 as a seed layer on the side wall of the via hole 31, the electrolytic plating layer 52 may be coupled to the side wall of the via hole 31 through the electroless plating layer 51.

In the present embodiment, when the porous layer 25 is formed on the first electrode layer 20, a portion of the first electrode layer 20 exposed through the via hole 31 is irradiated with a laser, for example. Since the temperature of the processing surface may be controlled well in the laser processing, the porous layer 25 may easily be formed by using a laser.

In the present embodiment, the first electrode layer 20 is formed using a conductive paste containing the conductive filler 21 and the binder 22. The binder 22 made of a resin, for example, has high infrared absorptivity and it is easy to process by a laser having a wavelength in the infrared region. In contrast, the conductive filler 21 made of a metal, for example, has low infrared absorptivity and it is hard to process by a laser having a wavelength in the infrared region. As a result, when the portion of the first electrode layer 20 exposed through the via hole 31 is processed by a laser, the wavelength of the laser is preferably in the infrared region. This makes it possible to more reliably burn and eliminate the binder 22 in the portion of the first electrode layer 20 exposed through the via hole 31, and to easily form a network structure by achieving appropriate fusing and bonding of the conductive filler 21. Thus, the porous layer 25 suitable to fit the via conductor 50 may easily be formed in the portion of the first electrode layer 20 exposed through the via hole.

In the electronic component 100 according to the present embodiment, the substrate 10 may be used as an anode of a capacitor, and the first electrode layer 20 may be used as a cathode of the capacitor, for example. For example, the substrate 10 may be used as a common anode, and the first electrode layer 20 being a cathode may be provided on both surfaces of the substrate 10. In the case above, the capacitance density of the capacitor may be increased to twice of that of the capacitor in which the cathode is formed on one surface of the substrate 10. The capacitor including the substrate 10 and the one or more first electrode layers 20 may be disposed in an array in the electronic component 100.

However, the substrate 10 and the first electrode layer 20 each are not necessarily an electrode of a capacitor. The electronic component 100 according to the present embodiment may be applied to any component as long as the component includes a wiring structure in which interlayer coupling is ensured by the via hole 31. The wiring structure including the substrate 10, the first electrode layer 20, the insulation layer 30, the second electrode layer 40, and the via conductor 50 may be provided in a multilayer substrate, for example, and more specifically, in an organic build-up substrate. The plurality of wiring structures may be provided in the organic build-up substrate.

Although the embodiments according to the present disclosure have been described above, the present disclosure is not limited to the above-described embodiments, and various modifications can be made without departing from the gist of the present disclosure.

Figure 7:
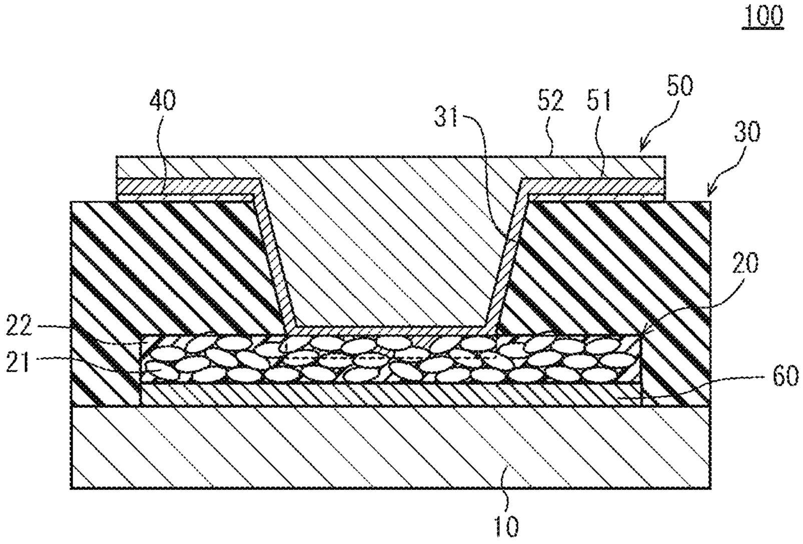
FIG. 7 is a sectional view of an electronic component according to a modification of the embodiment.

For example, in the electronic component 100 according to the above-described embodiment, the first electrode layer 20, the insulation layer 30, and the second electrode layer 40 are laminated in this order on the substrate 10. However, the electronic component 100 may include layers other than the first electrode layer 20, the insulation layer 30, and the second electrode layer 40. The electronic component 100 may include a conductive layer 60 provided between the substrate 10 and the first electrode layer 20 as illustrated in FIG. 7. The conductive layer 60 may be a carbon layer containing a carbon filler, for example. The carbon layer may be formed by applying a binder containing a carbon filler to a predetermined region on the substrate 10 by sponge transfer, screen printing, spray application, a dispenser, ink jet printing, or the like.

REFERENCE SIGNS LIST

100 ELECTRONIC COMPONENT
10 SUBSTRATE
20 FIRST ELECTRODE LAYER
21 CONDUCTIVE FILLER
22 BINDER
23 VIA HOLE PORTION
231 COUPLING LAYER

232 BASE LAYER
24 NON-VIA HOLE PORTION
25 POROUS LAYER
30 INSULATION LAYER
31 VIA HOLE
40 SECOND ELECTRODE LAYER
41 METAL FILM
50 VIA CONDUCTOR
51 ELECTROLESS PLATING LAYER
52 ELECTROLYTIC PLATING LAYER
60 CONDUCTIVE LAYER

The invention claimed is:

1. An electronic component comprising:
- a substrate;
- a first electrode layer on the substrate and including conductive fillers and a binder;
- an insulation layer on the first electrode layer,
- the insulation layer having a via hole that penetrates the insulation layer in a lamination direction of the substrate, the first electrode layer, and the insulation layer; a second electrode layer on the insulation layer; and
- a via conductor in the via hole, the via conductor electrically coupling the first electrode layer and the second electrode layer,
- wherein a portion of the first electrode layer overlapping with the via hole in a top view includes a coupling layer coupled to the via conductor,
- the coupling layer having a content rate of the binder lower than a content rate of the binder in a portion of the first electrode layer positioned outside the via hole in the top view,
- and wherein in the coupling layer, the conductive fillers are bonded to each other,
- and part of the via conductor is present in a gap between the bonded conductive fillers.

2. The electronic component according to claim 1, wherein the portion of the first electrode layer overlapping with the via hole in the top view further includes:
- a base layer between the coupling layer and the substrate, and
- a content rate of the binder in the base layer is larger than a content rate of the binder in the coupling layer.

3. The electronic component according to claim 1, wherein a content rate of the conductive filler in a portion of the first electrode layer positioned outside the via hole in the top view is 30 vol % to 80 vol %.

4. The electronic component according to claim 1, wherein the coupling layer has surface roughness Rz of 1 μm to 10 μm.

5. The electronic component according to claim 1, wherein the via conductor includes an electroless plating layer on a side wall of the via hole and an electrolytic plating layer on the electroless plating layer.

6. The electronic component according to claim 1, further comprising:
- a conductive layer between the substrate and the first electrode layer.

7. An electronic component comprising:
- a substrate;
- a first electrode layer on the substrate and including conductive fillers and a binder;
- an insulation layer on the first electrode layer, the insulation layer having a via hole that penetrates the insulation layer in a lamination direction of the substrate, the first electrode layer, and the insulation layer;
- a second electrode layer on the insulation layer; and
- a via conductor in the via hole, the via conductor electrically coupling the first electrode layer and the second electrode layer,
- wherein a portion of the first electrode layer overlapping with the via hole in a top view includes a coupling layer coupled to the via conductor,
- wherein in the coupling layer the conductive fillers are bonded to each other and a part of the via conductor is present in a gap between the bonded conductive fillers,
- wherein the portion of the first electrode layer overlapping with the via hole in the top view further includes a base layer between the coupling layer and the substrate, and
- wherein a content rate of the binder in the base layer is larger than a content rate of the binder in the coupling layer.

8. The electronic component according to claim 7, wherein the conductive filler has a melting point of 1100° C. or less.

9. The electronic component according to claim 7, wherein the first electrode layer has a thickness of 10 μm to 40 μm.

10. The electronic component according to claim 7, wherein the coupling layer has surface roughness Rz of 1 μm to 10 μm.

11. The electronic component according to claim 7, wherein the insulation layer has a thickness of 20 μm to 50 μm.

12. The electronic component according to claim 7, wherein the insulation layer is made of an epoxy-based resin.

13. The electronic component according to claim 7, wherein the via hole has a section of a circular shape, and a diameter of the via hole on a side of the first electrode layer is 40 μm to 120 μm.

14. The electronic component according to claim 13, further comprising:
- a conductive layer between the substrate and the first electrode layer.

15. The electronic component according to claim 14, wherein the conductive layer is a carbon layer containing a carbon filler.

16. The electronic component according to claim 7, wherein the via conductor includes an electroless plating layer on a side wall of the via hole and an electrolytic plating layer on the electroless plating layer.

* * * * *